United States Patent [19]
Wirth et al.

[11] Patent Number: 5,663,647
[45] Date of Patent: Sep. 2, 1997

[54] SWITCHING GRADIENT AMPLIFIER WITH ADJUSTABLE DC BUS VOLTAGE

[75] Inventors: William Frederick Wirth, Johnson Creek, Wis.; John N. Park, Rexford, N.Y.

[73] Assignee: General Electric Company, Milwaukee, Wis.

[21] Appl. No.: 581,282

[22] Filed: Dec. 29, 1995

[51] Int. Cl.$^6$ ............................................. G01R 33/38
[52] U.S. Cl. ............................................. 324/322
[58] Field of Search ............................ 324/300, 307, 324/318, 322; 128/653.2, 653.5; 323/355

[56] References Cited

U.S. PATENT DOCUMENTS

| | | | |
|---|---|---|---|
| 5,235,281 | 8/1993 | Haragashira et al. | 324/318 |
| 5,270,657 | 12/1993 | Wirth et al. | 324/322 |
| 5,311,136 | 5/1994 | Takahashi | 322/322 |

*Primary Examiner*—Sandra L. O'Shea
*Assistant Examiner*—Roger Phillips
*Attorney, Agent, or Firm*—James O. Skarsten; John H. Pilarski

[57] ABSTRACT

An amplification device is provided for driving a gradient coil in an MR system, wherein the gradient coil is required to generate a rapidly changing gradient magnetic field during a first time period, and a substantially constant field during an immediately following second time period. The device includes a adjustable bus, for providing first and second voltage levels, and a switching or PWM amplifier. A switch is coupled between the bus and the switching amplifier for applying the first voltage to the amplifier during the first time period, and the second voltage to the amplifier during the second time period. The switching amplifier comprises an inverter for generating a PWM voltage in response to its input, and an LC filter for converting the PWM wave into a DC voltage. The switching amplifier generates a substantially higher coil driving voltage during the first period, in response to the first voltage level, than during the second period in response to the second voltage level. The switching amplifier may have a substantially higher frequency of operation during the second period than during the first period, so that the LC filter is much more effective in removing a distorting ripple component during such second time period, when the gradient coil is being used to acquire MR data.

8 Claims, 2 Drawing Sheets

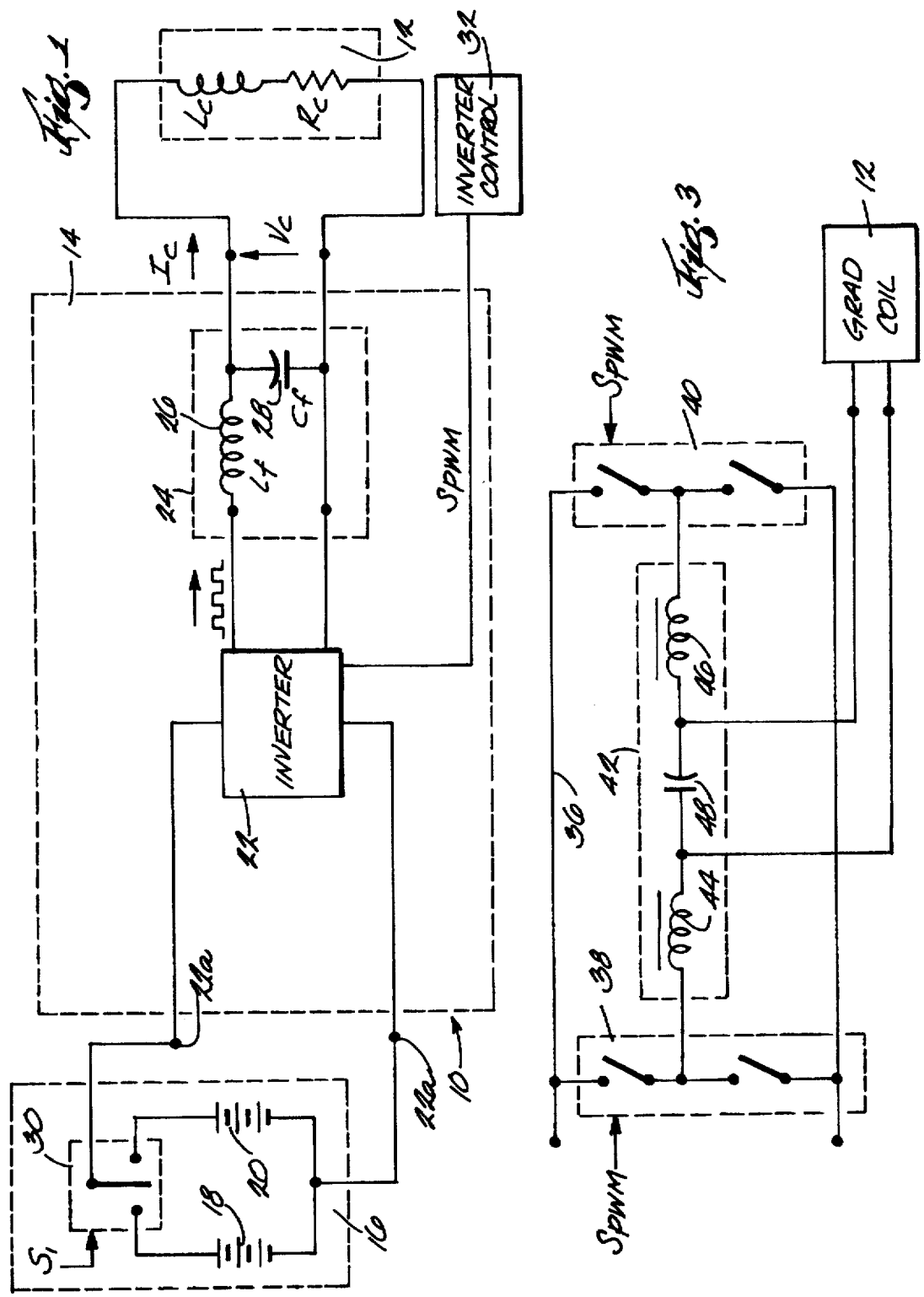

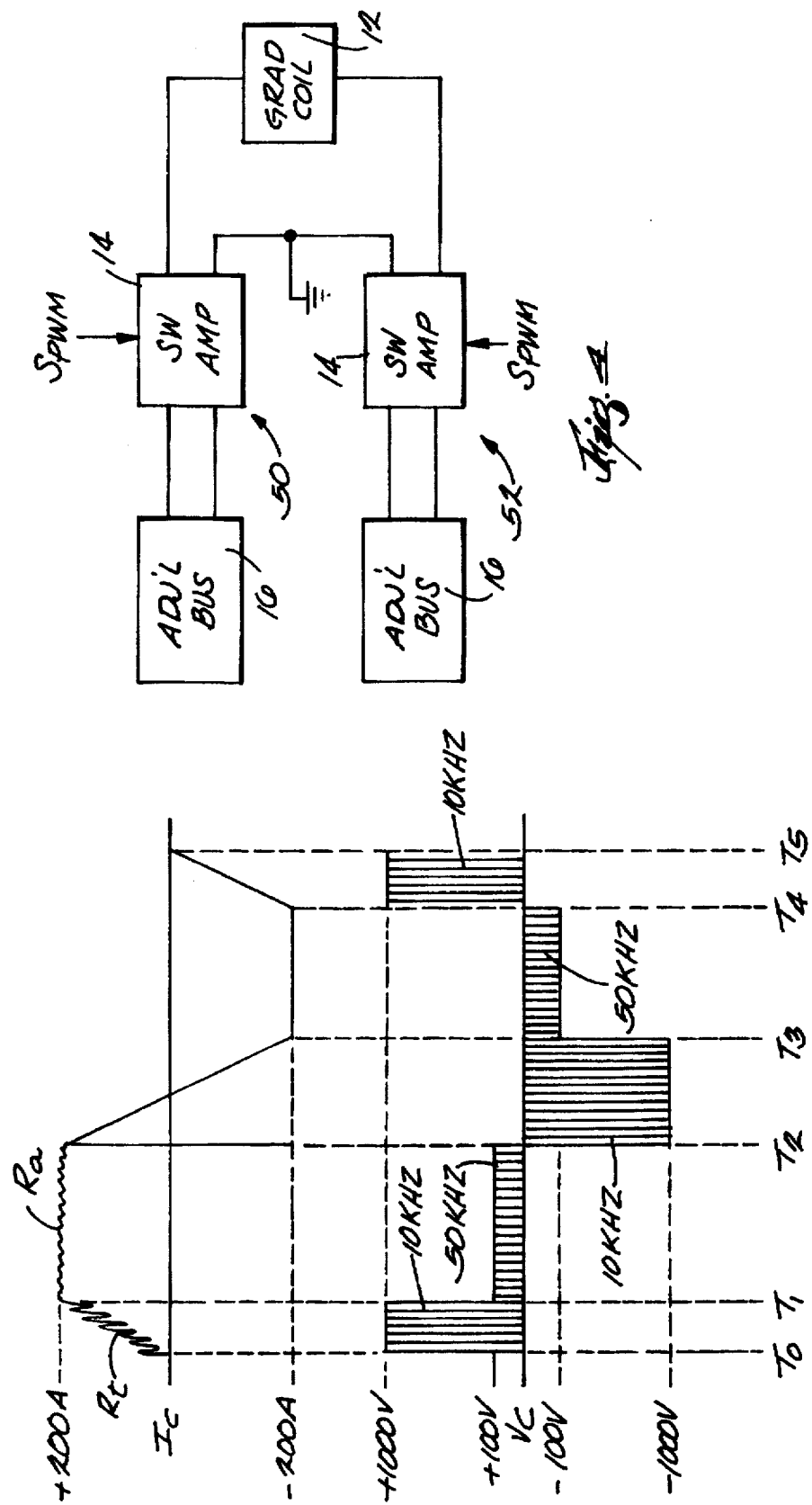

5,663,647

SWITCHING GRADIENT AMPLIFIER WITH ADJUSTABLE DC BUS VOLTAGE

BACKGROUND OF THE INVENTION

The invention disclosed and claimed herein generally pertains to an improved amplifier for driving a gradient coil in a magnetic resonance (MR) imaging system. More particularly, the invention pertains to a single switching amplifier adapted to drive the gradient coil to produce both rapidly changing and substantially constant gradient fields, as required for a specified imaging sequence.

The magnetic field characteristic of an MR gradient coil, with respect to time, is generally of a trapezoidal shape, with very steeply sloping sides. Accordingly, the current provided by a gradient amplifier to drive the coil must likewise have a trapezoidal-shaped characteristic. During the flat top portion of the trapezoid, i.e., when the drive current is substantially constant at a maximum value, the voltage (I*R) required by the gradient coil is primarily determined by the resistance R of the copper windings of the coil (I* is the complex current). However, during the ramped or sloping portions of the trapezoidal current characteristic, when current is rapidly changing between levels of constant current, an additional voltage proportional to the rate of current change (Ldi/dt) is required by the large inductance L of the coil. The Ldi/dt voltage is typically ten to twenty times the I*R voltage. This generally requires compromises in the design of gradient current amplifiers.

In one prior art approach, a linear amplifier is used. Such amplifier is sized for the maximum Ldi/dt voltage that can be encountered, resulting in very large power dissipation at the low I*R voltages which occur during the flat top portion of amplifier operation.

In another approach, a switching amplifier, also known as a switch mode or pulse width modulated (PWM) amplifier, is used to drive the MR gradient coil. A switching amplifier generally comprises an inverter and a high frequency filter. The inverter generates a train of rectangular voltage pulses which are applied to the filter, which is in series with the gradient coil. The filter removes high frequency components of the output voltage applied to the coil so that the principal component of such output voltage is DC. In an MR gradient application, the filter must be comparatively small, in order to allow fast current slew rates, i.e., rapid transition in current between constant current levels. However, a filter which is sufficiently small to allow rapid current change will tend to be too small to remove ripple from the drive current during flat top or constant current operation. Ripple is a component of the square wave, or switching frequency, generated by the inverter. Ripple disturbance is undesirable during flat top periods of gradient operation, since MR data is generally acquired during these periods. In addition, the bus voltage required for the Ldi/dt voltage results in large switching losses during flat tops, even though the amplifier operates at low duty cycles.

A further approach to improve gradient amplifier performance has been to employ a system with two separate amplifiers, one optimized for I*R voltages, and the other for the Ldi/dt voltage. For example, a linear amplifier, with good high fidelity, may be used for flat top periods of gradient operation and a switching amplifier may be used for ramps or current transition periods. However, this approach requires additional parts and components, and thereby increases costs and tends to reduce reliability.

SUMMARY OF THE INVENTION

Apparatus is provided for driving a gradient coil in an MR system, wherein the gradient coil is required to generate a rapidly changing gradient magnetic field during a first time period, and a substantially constant field during a subsequent second time period. The apparatus includes amplifier means, for generating a coil driving voltage which is applied to the coil, and first and second voltage sources for providing respective first and second voltages of selectively different amplitudes. A switch is coupled between the voltage sources and the amplifier means for applying the first voltage to the amplifier means during the first time period, and for applying the second voltage to the amplifier means during the second time period. The amplifier means generates a selectively different coil driving voltage in response to the first voltage than to the second voltage.

In a preferred embodiment, the amplifier means comprises an inverter for generating a PWM voltage and an LC filter for converting the PWM wave into a predominantly DC voltage. Preferably, the first voltage is substantially higher than the second voltage, such as on the order of ten times higher. The frequency of operation may be on the order of four or five times higher during the second period than during the first period. Alternatively, the frequency may be the same during both periods.

OBJECTS OF THE INVENTION

An object of the invention is to provide a single switching amplifier for use in driving an MR gradient coil during different phases of coil operation.

Another object is to provide an amplifier of the above type which may provide more optimal results, both during transition periods, when current is rapidly changing, and when current is being held constant such as at a maximum level.

Another object is to provide an amplifier of the above type which achieves its results by adjusting the DC bus voltage applied as the input to the inverter, so that such voltage is set to the minimum level required by the gradient coil load, as such load varies during gradient coil operation.

These and other objects of the invention will become more readily apparent from the ensuing specification, taken together with the accompanying drawings.

BRIEF DESCRIPTION OF THE DRAWINGS

FIG. 1 is a block diagram showing an embodiment of the invention in simplified form.

FIG. 2 shows the voltage and current waveforms of the embodiment of FIG. 1.

FIG. 3 is a diagram showing an inverter for use in the embodiment of FIG. 1.

FIG. 4 is a block diagram showing a modification of the embodiment shown in FIG. 1.

DETAILED DESCRIPTION OF THE PREFERRED EMBODIMENT

Referring to FIG. 1, there is shown an amplifier arrangement 10 for driving an MR gradient coil 12, having an inductance $L_c$ and a resistance $R_c$, for an MR imaging system (not shown). The amplifier arrangement 10 generally comprises a switching amplifier 14 and an adjustable bus 16, such as a bilevel bus, provided with two DC voltage sources 18 and 20. Usefully, source 18 provides a voltage of 1000 volts, and source 20 provides a voltage of 100 volts. Switch amplifier 14 comprises an inverter 22 and an LC filter 24, which includes one or more inductors 26, providing a collective inductance $L_f$, and one or more capacitors 28, providing a collective capacitance $C_f$. FIG. 1 further shows a switch 30 positioned in bus 16. Switch 30 is operable to selectively couple either the 1000 volt source 18 or the 100 volt source 20 to input terminals 22a of inverter 22.

As stated above, inverter 22 comprises a PWM device which receives an input voltage, and produces a square wave output voltage in response thereto, the widths of respective pulses being variable as required. Moreover, the amplitude of the square wave is directly proportional to the amplitude of the input voltage. Thus, for a given amplification factor of inverter 22, the amplitude of the inverter output when source 18 is applied thereto will be ten times greater than the output amplitude when source 20 is applied thereto. For simplification, inverter 22 has an amplification factor of unity, so that the respective outputs thereof are 1000 volts or 100 volts, as source 18 or source 20 is coupled to the inverter by selective operation of switch 30. Switch 30 may be driven by a switch control signal $S_1$, coupled thereto from an MR system control (not shown).

As is known, in an "H" bridge inverter of a type described hereinafter in connection with FIG. 3, there are two legs containing switches, which are driven by a signal $S_{pwm}$ from an oscillator or like inverter control device 32. By selectively adjusting the phasing between respective pulses provided by the two legs, the polarity of the filtered output voltage provided by the LC filter 26 will be positive or negative, as required. Also, the frequency of the square wave inverter output can be varied by adjusting the frequency of the clock signal of the control 32.

LC filter 24 receives the square wave inverter output voltage, and processes it to apply a DC voltage $V_c$ across gradient coil 12, to drive the coil with a current $I_c$. Filter 24 is usefully designed to provide an output having an amplitude equal to the square wave amplitude, so that $V_c$ is 1000 volts or 100 volts, as determined by operation of switch 30.

Referring to FIG. 2, there is shown the current $I_c$ which is required to drive gradient coil to produce a gradient magnetic field. $I_c$ is zero prior to a time $T_0$. At such time, $I_c$ must rapidly (e.g., within hundreds of micro seconds) increase from zero to 200 amps, at a time $T_1$. $I_c$ then remains constant at 200 amps, until time $T_2$, when it rapidly decreases (e.g., within hundreds of micro seconds) to −200 amps at a time $T_3$. Current $I_c$ then remains constant at a level of −200 amps until a time $T_4$, when it increases to zero at a time $T_5$.

FIG. 2 further shows the voltage $V_c$ required to achieve the current characteristic $I_c$ shown therein. Thus, at time $T_0$, by operation of switch 30, voltage $V_c$ is selected to be +1000 volts. Such voltage meets the high voltage requirement imposed by the term Ldi/dt for rapidly increasing current. Then, between $T_1$ and $T_2$, $V_c$ is set to +100 volts, again by operation of switch 30. Such lower voltage meets the reduced coil voltage requirement, referred to above, for constant coil current. Between $T_2$ and $T_3$, the phasing between the two legs of the inverter is changed, as described above. Accordingly, a large negative voltage of −1000 volts is applied to the coil, to achieve rapid decrease in current $I_c$. Between $T_3$ and $T_4$, $I_c$ is set to −100 volts, and between $T_4$ and $T_5$ is set to 1000 volts.

During the 100 volt mode of operation of switching amplifier 14, filter 24 operates at a level of loss which is substantially lower than during the 1000 volt periods of operation. It has been found that if inverter 22 is operated to generate a square wave on the order of 10 KHz at 1000 volts, and a square wave on the order of 50 KHz at 100 volts, the losses for the lower voltage operation will still be less than for the higher 1000 volt level of operation. At the same time, the filter 24, for a given size of filter components, becomes increasingly effective, as frequency is increased, in reducing ripple from its DC output. This is illustrated in FIG. 2, which shows ripple component $R_t$ and $R_a$ of current $I_c$. $R_t$ is the component during a transition between $T_0$ and $T_1$, when $V_c$ is the filtered output of a 1000 volt 10 KHz square wave, and $R_a$ is the component during a constant current or flat top period between $T_1$ and $T_2$, when $V_c$ is the filtered output of a 100 volt 50 KHz square wave. FIG. 2 shows ripple component $R_a$ to be substantially less than component $R_t$. Thus, by operating inverter 22 with the dual voltage-dual frequency modes described above, voltage $V_c$ is sufficient to meet the high voltage requirement for current $I_c$ transitions, while minimizing current ripple during constant current periods, when data is being acquired.

Referring to FIG. 3, there is shown a full bridge single phase inverter ("H" bridge) 36, useful as inverter 22. Bridge inverter 36 comprises switches 38 and 40, such as insulated gate bipolar transistor (IGBT) switches, or other semiconductor devices such as those respectively known in the art as MOSFET's, darlingtons, MCT's, GTO's and bipolar transistors. The switches 38 and 40 are driven at a rate determined by the clock (not shown) of the inverter control 32 to provide the dual frequency voltages referred to above, i.e., 10 KHz for a square wave output voltage of 1000 volts, and 50 KHz for an output voltage of 100 volts. The output of the H-bridge legs 38 and 40 drives the gradient coil 12 through an LC filter comprising inductors 44 and 46, both on the order of 23 micro Henrys, and a capacitor 48 on the order of one micro Farad, the capacitors and inductors being connected to one another and to bridge inverter 36 as shown in FIG. 3.

Referring to FIG. 4, there is shown a modification of the invention, wherein two amplifiers 50 and 52 are connected to a single gradient coil 12, to respectively provide the positive and negative voltages required for the operation thereof. Both of the amplifiers 50 and 52 are identical or similar to the amplifier arrangement 10, described above in connection with FIG. 1. The respective inverter for amplifiers 50 and 52, which are not shown but may be similar or identical to inverter 22, are coupled so that their respective output voltages add together. Both amplifiers are controlled by the signal $S_{pwm}$, which is selected so that the voltage $V_c$ applied to gradient coil 12 is positive or negative, respectively, as required. The use of two coil driving amplifiers 50 and 52 balances capacitively coupled ground currents in the gradient coil 12.

In a further modification of the invention, adjustable voltage bus 16 can be continuously adjusted, to any voltage in a range of voltages, wherein continual adjustment is made in real time. This is achieved through selective operation of the switch 30, in response to the control signal $S_{pwm}$, or through adjustment of one or more of the voltage sources 18 and 20. Thus, the voltage $V_c$ can dove the gradient coil 12 in accordance with characteristics or waveforms besides trapezoidal waveforms.

Obviously, many other modifications and variations of the present invention are possible in light of the above teaching. It is therefore to be understood that within the scope of the disclosed inventive concept, the invention may be practiced otherwise than as specifically described.

What is claimed is:

1. In an MR system having a gradient coil, gradient amplifier apparatus for driving said coil during first and second time periods comprising:

an adjustable voltage bus providing at least first and second voltage levels;

an inverter disposed to receive an input voltage for providing a PWM wave voltage having an amplitude determined by the amplitude of said received input voltage;

switch means for applying said first and second voltage levels as input voltages to said inverter during said first and second time periods, respectively; and means for filtering said PWM wave voltage to provide a DC voltage for driving said gradient coil, said DC coil driving voltage comprising first and second driving voltages during said first and second time periods, respectively, said inverter and said filtering means collectively comprising an amplifier means.

2. The apparatus of claim 1 wherein:

said amplifier means has an adjustable frequency of operation; and said amplifier means is responsive to a signal adjusting said frequency of operation so that said frequency is selectively higher during said second period than during said first period.

3. The apparatus of claim 1 wherein:

said apparatus includes means for applying a pulse width modulating signal to said inverter to selectively vary said pulse width, and to thereby select the polarity and magnitude of said DC coil driving voltage.

4. The apparatus of claim 1 wherein:

said first voltage level is on the order of ten times said second voltage level and said frequency during said second period is on the order of five times said frequency during said first period.

5. The apparatus of claim 1 wherein said apparatus comprises one of said amplifier means, one of said voltage buses and one of said switch means coupled to each side of said coil.

6. The apparatus of claim 1 wherein:

said voltage bus is continuously adjustable to any voltage in a range of voltages.

7. The apparatus of claim 6 wherein:

said voltage bus is adjustable in real time.

8. The apparatus of claim 1 wherein:

said amplifier means has a frequency of operation which is substantially constant during said first and second periods.

* * * * *